United States Patent
Li et al.

(10) Patent No.: US 10,727,323 B2
(45) Date of Patent: Jul. 28, 2020

(54) THREE-DIMENSIONAL (3D) TUNNELING FIELD-EFFECT TRANSISTOR (FET)

(71) Applicant: International Business Machines Corporation, Armonk, NY (US)

(72) Inventors: Juntao Li, Cohoes, NY (US); Kangguo Cheng, Schenectady, NY (US); Peng Xu, Santa Clara, CA (US); Heng Wu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/864,685

(22) Filed: Jan. 8, 2018

(65) Prior Publication Data
US 2019/0214487 A1 Jul. 11, 2019

(51) Int. Cl.
| H01L 29/66 | (2006.01) |
| H01L 21/324 | (2006.01) |
| H01L 29/786 | (2006.01) |
| H01L 29/06 | (2006.01) |
| H01L 29/739 | (2006.01) |
| H01L 29/78 | (2006.01) |

(52) U.S. Cl.
CPC .... *H01L 29/66977* (2013.01); *H01L 21/3247* (2013.01); *H01L 29/0653* (2013.01); *H01L 29/0657* (2013.01); *H01L 29/66356* (2013.01); *H01L 29/66545* (2013.01); *H01L 29/66742* (2013.01); *H01L 29/7391* (2013.01); *H01L 29/78618* (2013.01); *H01L 29/78684* (2013.01); *H01L 29/78696* (2013.01); *H01L 29/785* (2013.01); *H01L 29/7854* (2013.01)

(58) Field of Classification Search
None
See application file for complete search history.

(56) References Cited

U.S. PATENT DOCUMENTS

| 5,825,049 | A | 10/1998 | Simmons et al. |
| 7,465,976 | B2 | 12/2008 | Kavalieros et al. |
| 8,258,031 | B2 | 9/2012 | Lauer et al. |
| 8,916,927 | B2 | 12/2014 | Bhuwalka et al. |
| 9,040,957 | B2 | 5/2015 | Lee et al. |

(Continued)

FOREIGN PATENT DOCUMENTS

WO 2012152762 A1 11/2012

OTHER PUBLICATIONS

S. Cristoloveanu et al., "A Review of Sharp-Switching Devices for Ultra-Low Power Applications," IEEE Journal of the Electron Devices Society, Sep. 2016, pp. 215-226, vol. 4, No. 5.

(Continued)

*Primary Examiner* — Zandra V Smith
*Assistant Examiner* — Lawrence C Tynes, Jr.
(74) *Attorney, Agent, or Firm* — Vazken Alexanian; Ryan, Mason & Lewis, LLP

(57) ABSTRACT

A method for manufacturing a transistor device includes forming a plurality of fins on a substrate, performing an annealing process to cause the fins to have a round shape, growing an epitaxial semiconductor layer on a surface of each fin, wherein the epitaxial semiconductor layer is formed along the round shape, and forming a gate structure on the substrate, wherein the gate structure is formed on the epitaxial semiconductor layer on the surface of each fin.

13 Claims, 15 Drawing Sheets

(56) References Cited

U.S. PATENT DOCUMENTS

| | | | |
|---|---|---|---|
| 9,276,102 B2 | 3/2016 | Le Royer et al. | |
| 9,293,467 B2 | 3/2016 | Moselund et al. | |
| 9,385,195 B1 | 7/2016 | Zhang | |
| 2006/0258072 A1 | 11/2006 | Kavalieros et al. | |
| 2006/0267108 A1 | 11/2006 | Patil | |
| 2006/0284245 A1* | 12/2006 | Park | H01L 29/1033 |
| | | | 257/324 |
| 2007/0052012 A1 | 3/2007 | Forbes | |
| 2014/0008734 A1* | 1/2014 | Lu | H01L 21/2652 |
| | | | 257/401 |
| 2014/0197456 A1* | 7/2014 | Wang | H01L 29/785 |
| | | | 257/192 |
| 2016/0064524 A1 | 3/2016 | Chuang et al. | |
| 2017/0033013 A1* | 2/2017 | Kim | H01L 21/823431 |
| 2017/0243792 A1* | 8/2017 | Li | H01L 21/823431 |
| 2018/0145076 A1* | 5/2018 | Wang | H01L 27/0924 |

OTHER PUBLICATIONS

Z. Yang et al., "Impact of Source Height on the Characteristic of U-Shaped Channel Tunnel Field-Effect Transistor," Superlattices and Microstructures, Nov. 2017, pp. 1226-1232, vol. 111.

* cited by examiner

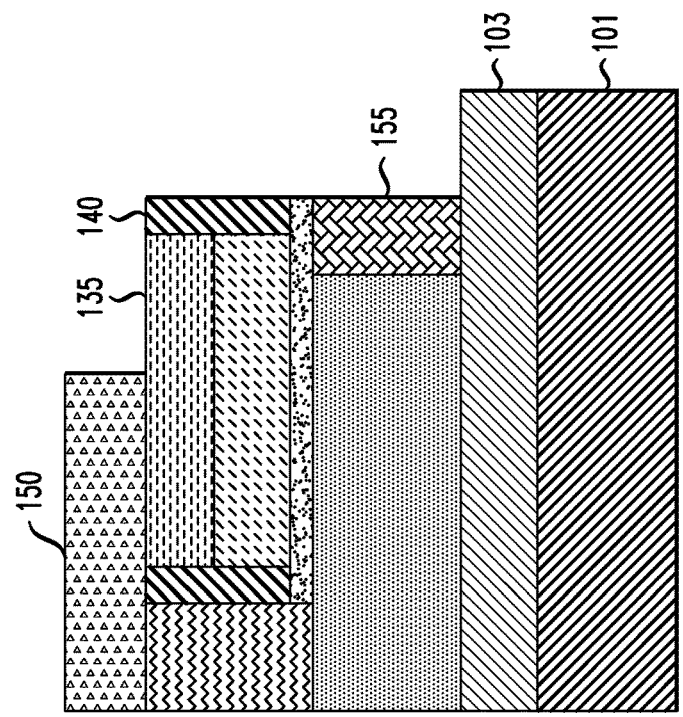
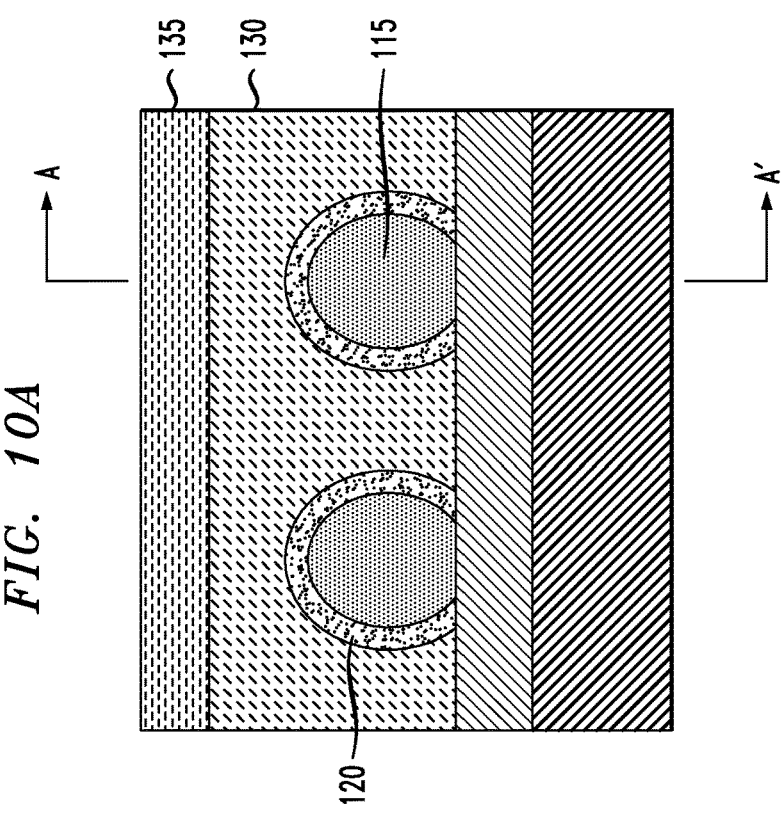

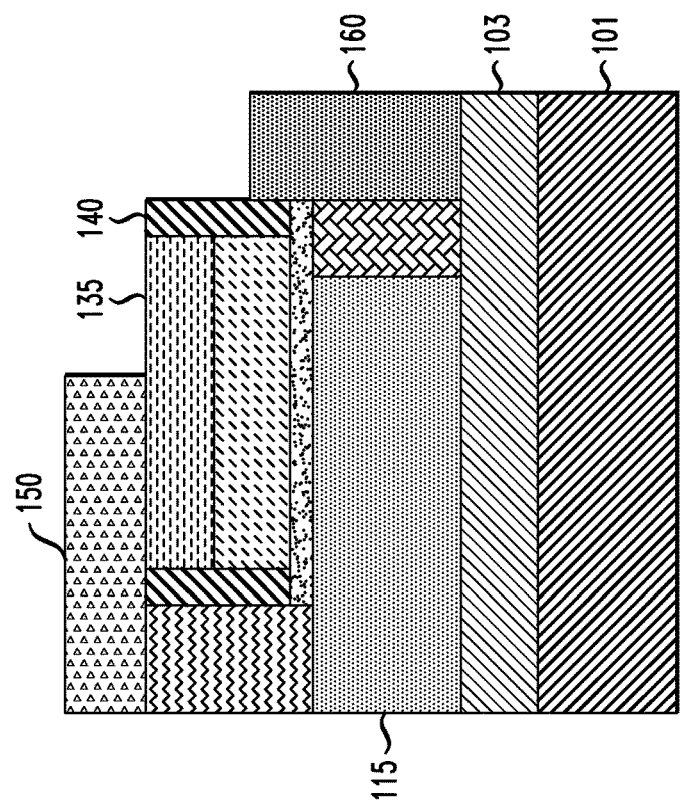
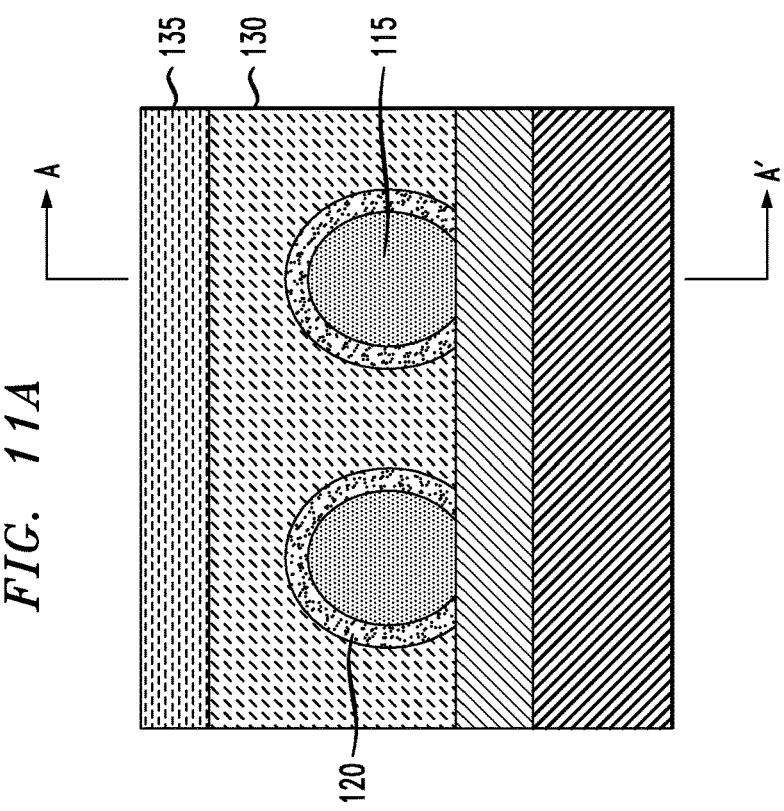
FIG. 11B
FIG. 11A

AA' CROSS SECTION

BB' CROSS SECTION

US 10,727,323 B2

THREE-DIMENSIONAL (3D) TUNNELING FIELD-EFFECT TRANSISTOR (FET)

BACKGROUND

Scaling down of complementary metal-oxide semiconductor (CMOS) transistors results in increased power consumption and short channel effects. Tunnel field-effect transistors (TFETs), which use a band-to-band tunneling (BTBT) mechanism, have been investigated as one of the more promising next-generation devices for low-power applications. TFETs are devices suited for low power applications because the TFETs, for example, exhibit steep sub-threshold swing and weak temperature dependence.

TFETs also exhibit relatively low on-current ($I_{on}$), which can be undesirable. A heterostructure (source-channel) has been used to boost the on-current in a TFET. However, there remains a need for improved semiconductor device structures and methods of forming the same which address the need for increasing on-current.

SUMMARY

According to an exemplary embodiment of the present invention, a method for manufacturing a transistor device includes forming a plurality of fins on a substrate, performing an annealing process to cause the fins to have a round shape, growing an epitaxial semiconductor layer on a surface of each fin, wherein the epitaxial semiconductor layer is formed along the round shape, and forming a gate structure on the substrate, wherein the gate structure is formed on the epitaxial semiconductor layer on the surface of each fin.

According to an exemplary embodiment of the present invention, a transistor device includes a plurality of fins on a substrate, wherein each of the fins has a round shape, an epitaxial semiconductor layer on a surface of each fin, wherein the epitaxial semiconductor layer is formed along the round shape, and a gate structure on the substrate, wherein the gate structure is formed on the epitaxial semiconductor layer on the surface of each fin.

According to an exemplary embodiment of the present invention, a method for manufacturing a transistor device includes forming a plurality of fins on a substrate, wherein each of the plurality of fins comprises doped silicon germanium (SiGe), performing an annealing process to cause the fins to have a round shape, growing an epitaxial silicon layer on a surface of each fin, wherein the epitaxial silicon layer is formed along the round shape, and forming a gate structure on the substrate, wherein the gate structure is formed on the epitaxial silicon layer on the surface of each fin by a replacement metal gate process.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIGS. 10A and 10B are cross-sectional views illustrating back-filling a portion of a vacant area left by the recessing of the source/drain region with a dielectric material in a method of manufacturing of a transistor device, according to an embodiment of the present invention.

FIGS. 11A and 11B are cross-sectional views illustrating growth of a source/drain region in a method of manufacturing of a transistor device, according to an embodiment of the present invention.

DETAILED DESCRIPTION

Figure 2:
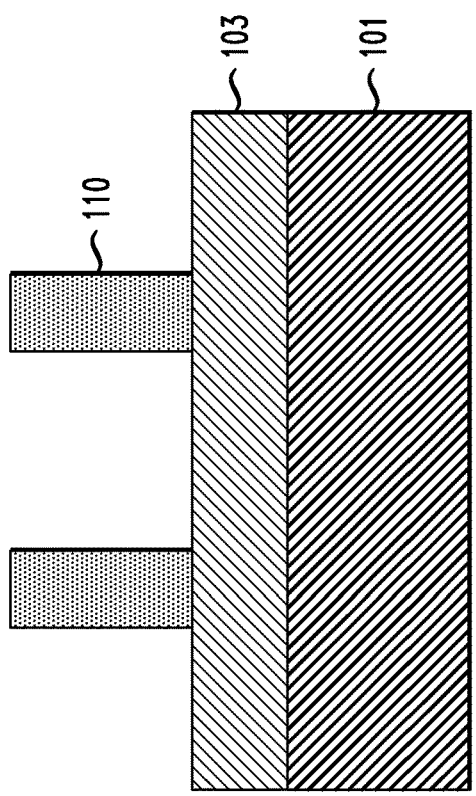
FIG. 2 is a cross-sectional view illustrating formation of semiconductor fins in a method of manufacturing of a transistor device, according to an embodiment of the invention.

Exemplary embodiments of the invention will now be discussed in further detail with regard to semiconductor devices and methods of manufacturing same and, in particular, to forming three-dimension (3D) tunnel field-effect transistors (TFETs) with greater source to channel tunneling area.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), TFET, nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, FETs, TFETS, MOSFETs, nanowire FETs, nanosheet FETs and/or FinFETs. By way of non-limiting example, the semiconductor devices can include, but are not limited to CMOS, FET, TFET, MOSFET, nanowire FET, nanosheet FET and FinFET devices, and/or semiconductor devices that use CMOS, FET, TFET, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "round", "rounding" or "rounded" refers to a shape of an element which includes an outer surface in a circular or oval shape or other similar shape in which an outer surface of the element is curved such that angles have been removed and corners have been formed into continuous arcs.

Embodiments of the present invention relate to methods and structures for forming 3D TFETs with greater source to channel tunneling area than conventional planar TFETs, which will result in higher on-current ($I_{on}$). In accordance with an embodiment of the present invention, a silicon (Si) channel wraps around a p-type doped (e.g., P+) silicon germanium (SiGe) core. Tunneling occurs around the perimeter of the core when the channel is inverted. The channel wraps around an oval or circular shaped doped core in accordance with an embodiment of the present invention, which has the effect of increasing tunneling area when compared with conventional planar TFETs.

Figure 1:
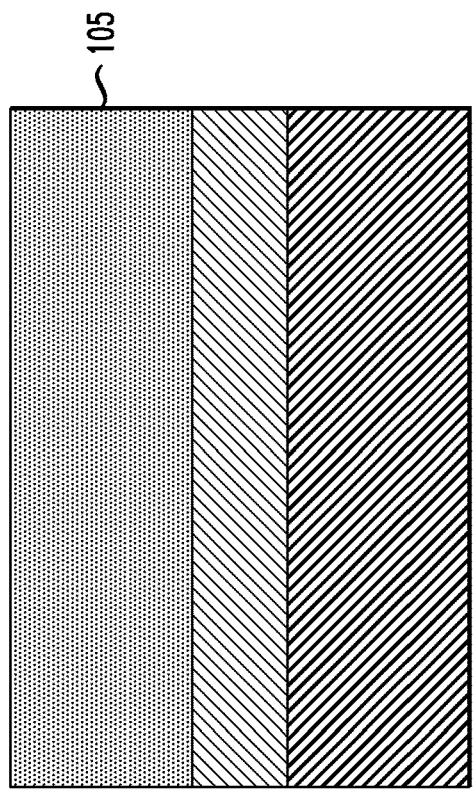
FIG. 1 is a cross-sectional view illustrating a semiconductor substrate including a semiconductor layer on a buried insulating layer in a method of manufacturing a transistor device, according to an embodiment of the invention.

FIG. 1 is a cross-sectional view illustrating a semiconductor substrate including a semiconductor layer on a buried insulating layer in a method of manufacturing of a transistor device, according to an embodiment of the invention. Referring to FIG. 1, a layer of a doped semiconductor 105, including, but not necessarily limited to, silicon germanium (SiGe) or germanium (Ge) is on a buried insulating layer 103 on a semiconductor substrate 101 (see also FIG. 2). In accordance with an embodiment of the present invention, the semiconductor layer 105 can be p-type (e.g., P+) doped, and is doped by, for example, ion implantation, in-situ, gas phase doping, plasma doping, plasma immersion ion implantation, cluster doping, infusion doping, liquid phase doping, solid phase doping, etc. Dopants may include, for example, boron (B), gallium (Ga), indium (In) or thallium (Tl) at various concentrations. It should be noted that the semiconductor layer 105 can be n-doped or p-doped. In various embodiments, the n-type dopants may include phosphorus (P), arsenic (As) and antimony (Sb), and p-type dopants include boron (B), gallium (Ga), and indium (In). In a non-limiting example, a dopant concentration range may be $1\times10^{20}/cm^3$ to $5\times10^{21}/cm^3$, with $4\times10^{20}/cm^3$ to $5\times10^{21}/cm^3$ preferred. Dopant concentrations that are lesser than, or greater than, the aforementioned concentration range may also be contemplated. The buried insulating layer 103 can be, for example, an oxide or a nitride. The insulator may be a crystalline or non-crystalline oxide or nitride. In one embodiment, the insulating layer 103 is an oxide such as, for example, silicon dioxide. In another embodiment, the insulating layer 103 is a nitride such as, for example, silicon nitride or boron nitride. In yet other embodiments, the insulating layer 103 is a multilayered stack of, in any order, silicon dioxide and boron nitride.

The semiconductor substrate 101 includes semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate.

FIG. 2 is a cross-sectional view illustrating formation of semiconductor fins in a method of manufacturing of a transistor device, according to an embodiment of the invention. Referring to FIG. 2, in accordance with an embodiment of the present invention, a plurality of fins 110, are formed by patterning the semiconductor layer 105 into the fins. Patterning is performed by a method known in the art, for example, sidewall image transfer and etching. In accordance with a non-limiting embodiment of the present invention, each fin 110 is patterned to be, for example, with a top surface about 10 nm to about 100 nm, preferably about 30 nm to about 50 nm, above the buried insulating layer 103, although higher or lower fin height may also be contemplated.

Figure 4:
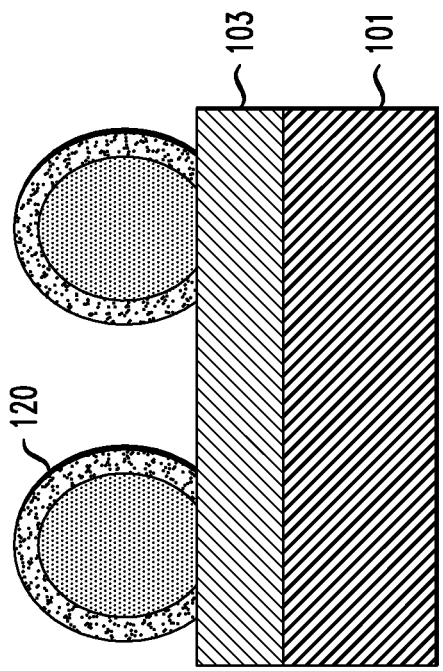
FIG. 4 is a cross-sectional view illustrating epitaxial growth of a semiconductor channel region on the rounded fins in a method of manufacturing of a transistor device, according to an embodiment of the invention.
Figure 3:
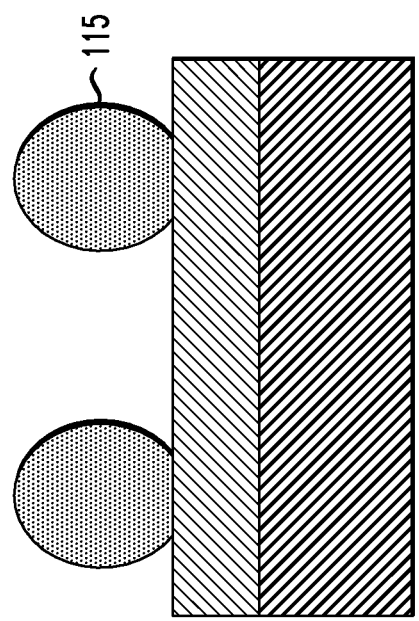
FIG. 3 is a cross-sectional view illustrating processing for rounding the fins in a method of manufacturing of a transistor device, according to an embodiment of the invention.

FIGS. 3 and 4 are cross-sectional views illustrating processing for rounding the fins and epitaxial growth of a semiconductor channel region on each of the rounded fins in a method of manufacturing of a transistor device, according to an embodiment of the invention. Referring to FIGS. 3 and 4, a high temperature annealing process is performed to form the fins 110 into a rounded shape, such as, for example, a circular or oval shape, resulting in the rounded fins 115 on the buried insulating layer 103. The rounded fins 115 are also referred to herein as rounded doped semiconductor regions or source/drain regions.

The high temperature annealing causes the shape of the fins to change such that an outer surface of each fin is curved, such that angles are removed and corners are formed into continuous arcs. The high temperature annealing can be performed in an environment, including, but not necessarily limited to, hydrogen, at a temperature in the range of, for example, about 500° C. to about 1200° C., such as between about 600° C. and about 1100° C., and preferably between about 800° C. and about 950° C. For example, a hydrogen anneal can be performed at 880° C. for a duration of 30 seconds. Another suitable anneal processes that may be used for rounding the surfaces of the fins includes a hydrogen anneal at 900° C. for 10 seconds.

According to embodiments of the present invention, the annealing is performed for a time period 1 millisecond to 30 minutes, and can be done by rapid thermal annealing (RTP), furnace annealing, flash annealing, laser annealing, spike annealing, or any suitable combination of those techniques. In accordance with an embodiment of the present invention, the annealing may be carried out for a variable period of time. In one example, the annealing process is carried out for a time period from about 0.5 seconds to 2 seconds, depending on temperature and size of the fins 110. The annealing process may be carried out at a single targeted temperature, or at various ramp and soak cycles using various ramp rates and soak times.

After the annealing, and the desired rounded shape has been achieved, a semiconductor channel region 120, including, but not necessarily limited to, silicon, strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof, is epitaxially grown each on the rounded doped semiconductor regions 115 (e.g., P+ SiGe). The semiconductor channel region 120 is formed around the outer surface along the perimeter or circumference of each of the rounded doped semiconductor regions 115. Each channel region 120 is formed along the round shape of the region 115 so that it corresponds to the round shape of the rounded doped semiconductor region 115 on which it is formed. Each channel region 120 follows the same or substantially the same arc shape of the rounded doped semiconductor region 115. In accordance with an embodiment of the present invention, the annealing and epitaxial growth is performed in the same epitaxy chamber.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

The epitaxial deposition process may employ the deposition chamber of a chemical vapor deposition type apparatus, such as a PECVD apparatus. A number of different sources may be used for the epitaxial deposition of the in-situ doped semiconductor material. In some embodiments, the gas source for the deposition of an epitaxially formed in-situ doped semiconductor material may include silicon (Si) deposited from silane, disilane, trisilane, tetrasilane, hexachlorodisilane, tetrachlorosilane, dichlorosilane, trichlorosilane, ldisilane and combinations thereof. In other examples, when the in-situ doped semiconductor material includes germanium, a germanium gas source may be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. By "in-situ" it is meant that the dopant that dictates the conductivity type of the doped layer is introduced during the process step, e.g., epitaxial deposition, that forms the doped layer.

FIGS. 5B, 6B, 7B, 8B, 9B, 10B, 11B, 12B, and 13B are cross-sectional views taken along the lines A-A' in FIGS. 5A, 6A, 7A, 8A, 9A, 10A, 11A, 12A, and 13A, respectively.

Figure 5B:
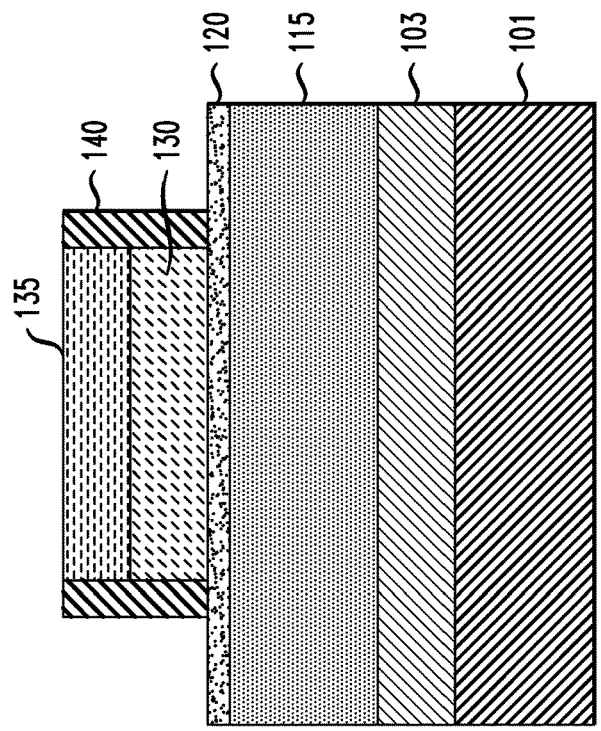
FIGS. 5A and 5B are cross-sectional views illustrating formation of a dummy gate and sidewall spacers in a method of manufacturing of a transistor device, according to an embodiment of the present invention.
Figure 5A:
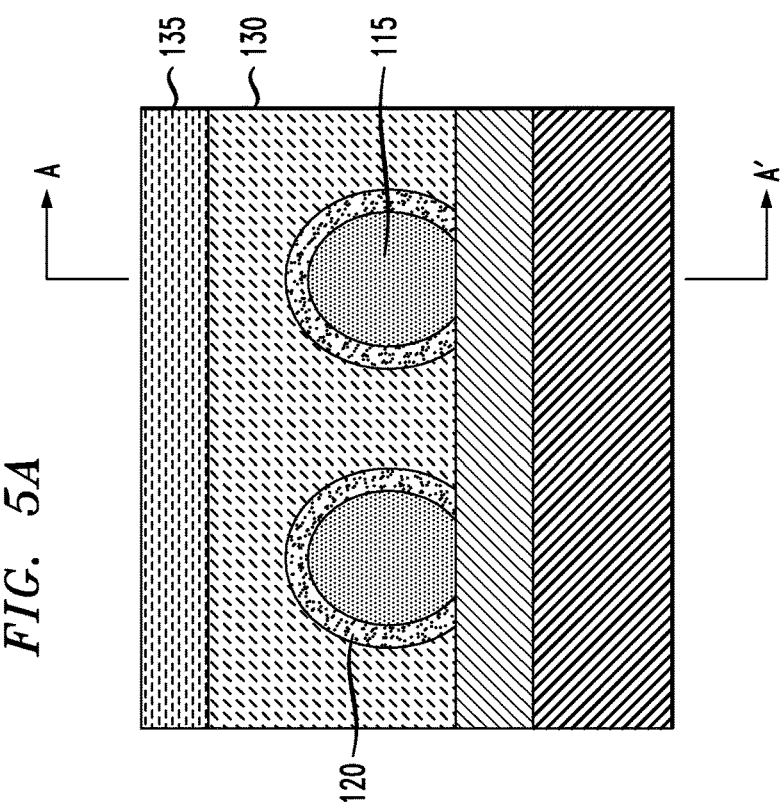

FIGS. 5A and 5B are cross-sectional views illustrating formation of a dummy gate and sidewall spacers in a method of manufacturing of a transistor device, according to an embodiment of the present invention. Referring to FIGS. 5A and 5B, a dummy gate layer 130 is formed on the buried insulating layer 103 and on and around the channel region 120, which is formed on the doped semiconductor regions 115. The dummy gate layer 130, includes, but is not necessarily limited to, polysilicon or amorphous silicon, is deposited using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD). A cap layer 135 is formed on top of the dummy gate layer 130 by one or more of the deposition techniques noted in connection with deposition of the dummy gate layer 130. The cap material can comprise for example, silicon nitride, silicon oxynitride, boron nitride, silicon boron nitride, or multilayered stacks thereof.

The spacers 140 can comprise, for example, oxides, nitrides or a combination thereof, such as, silicon oxide (SiOx), silicon nitride (SiN), boron nitride (BN), silicon boron nitride (SiBN), silicon oxynitride (SiON), silicon carbon nitro-oxide (SiCNO), and silicon carbon nitride (SiCN), and may be formed by any suitable deposition technique known in the art, including, but not limited to, by one or more of the deposition techniques noted above. A deposited spacer layer can be patterned by, for example, an isotropic etching process, such as reactive ion etching (ME), to form the spacers 140 along sides of dummy gate 130 and the cap layer 135, and eventually along sides of the metal gate structure, once the dummy gate is removed and replaced by the metal gate structure. Following the deposition of the multiple layers, the upper most surface may be planarized using, for example, chemical mechanical planarization (CMP) or other planarization process.

Figure 6B:
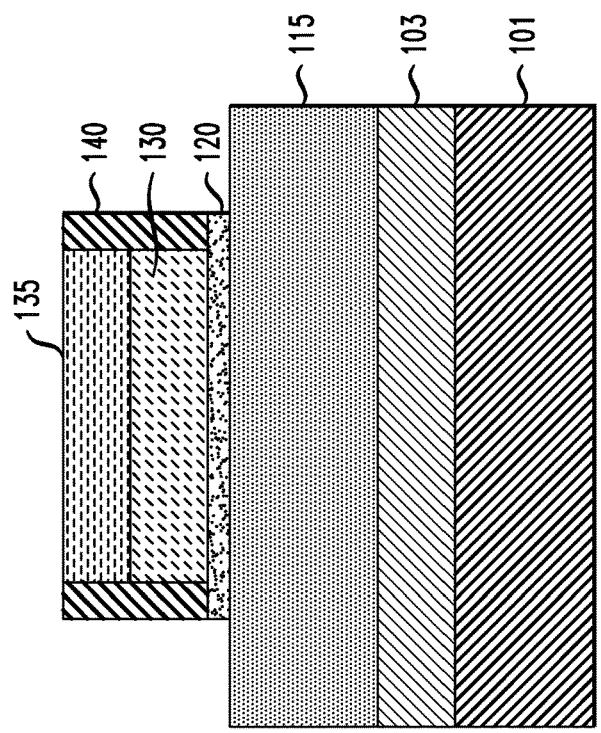
FIGS. 6A and 6B are cross-sectional views illustrating removal of a portion of the channel region on the outside of the sidewall spacers in a method of manufacturing of a transistor device, according to an embodiment of the present invention.
Figure 6A:
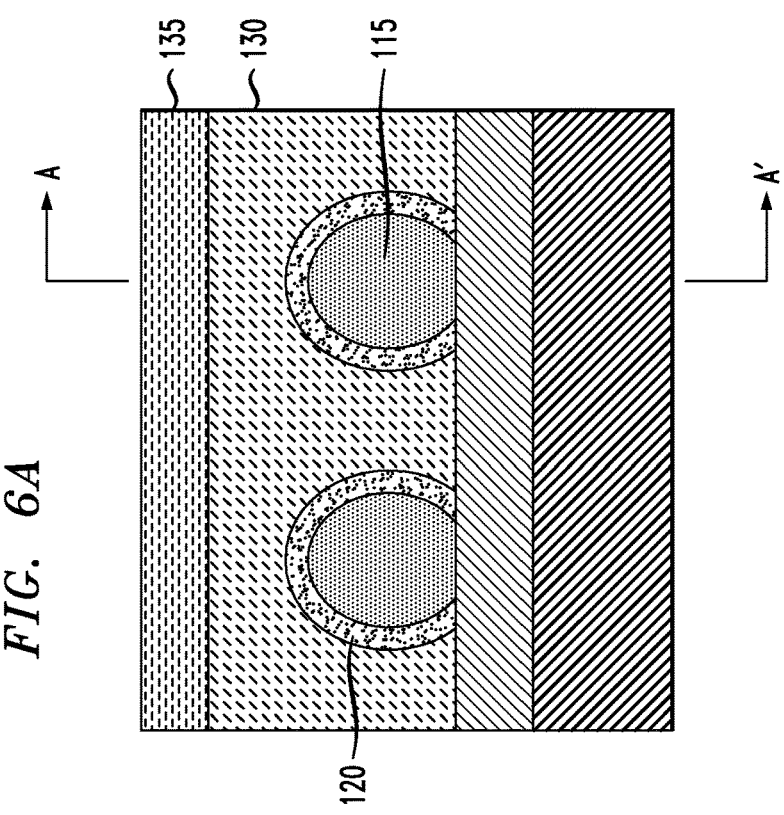

FIGS. 6A and 6B are cross-sectional views illustrating removal of a portion of the channel region on the outside of the sidewall spacers in a method of manufacturing of a transistor device, according to an embodiment of the present invention. Referring to FIGS. 6A and 6B, an exposed portion of the channel region 120 on the outside of the sidewall spacers 140 is removed using, for example, an etching process which removes the material of the channel region 120 (e.g., Si), from the surface of the doped semiconductor region 115, which includes, for example P+ SiGe. The etch process can include, for example, a wet etch containing ammonia. Any other suitable silicon etch process selective to P+ SiGe can also be used.

Figure 7B:
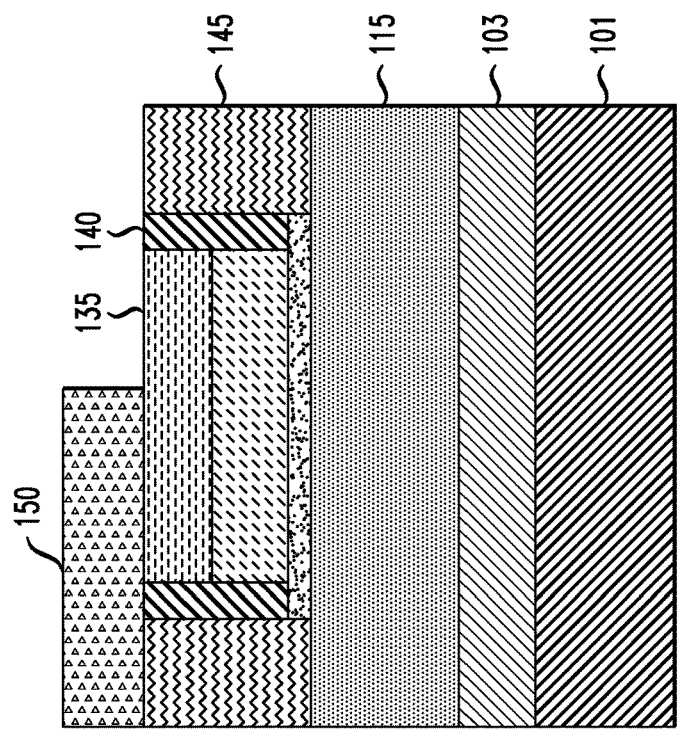
FIGS. 7A and 7B are cross-sectional views illustrating formation of an inter-layer dielectric (ILD) layer and hardmask in a method of manufacturing of a transistor device, according to an embodiment of the present invention.
Figure 7A:
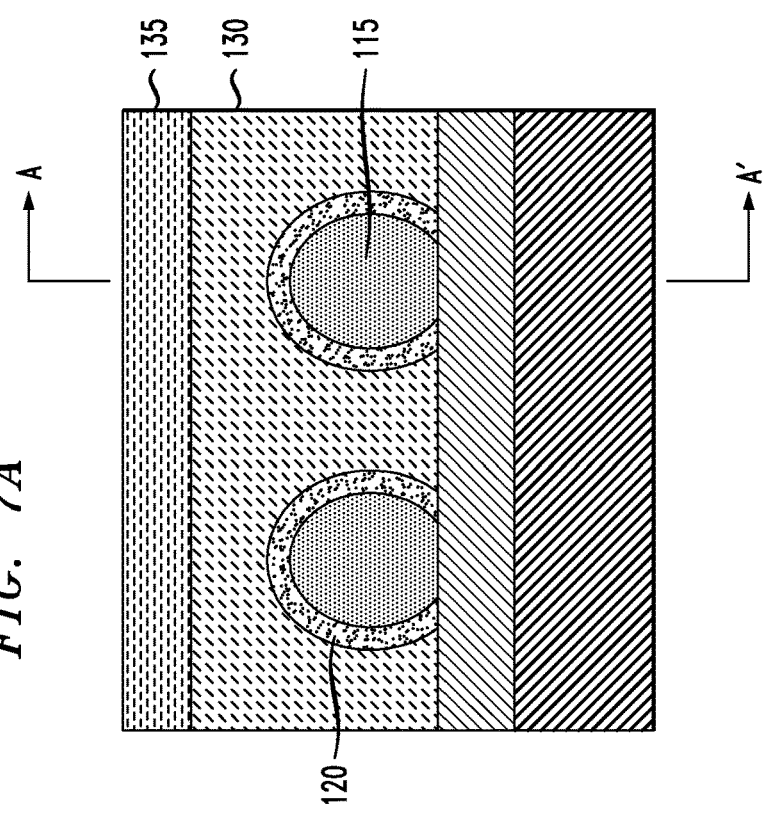

FIGS. 7A and 7B are cross-sectional views illustrating formation of an inter-layer dielectric (ILD) layer and hardmask in a method of manufacturing of a transistor device, according to an embodiment of the present invention. Referring to FIGS. 7A and 7B, a layer of, for example, silicon dioxide (SiO$_2$), low-temperature oxide (LTO), high-temperature oxide (HTO), or flowable oxide (FOX) is formed on the structure in FIGS. 6A and 6B using a deposition process, such as, for example, CVD, PECVD, PVD, ALD, MBD, PLD, and/or LSMCD. The deposited layer is planarized using a planarization process, such as, for example, CMP, to result in ILD layer 145. As can be seen, the ILD layer 145 is located on the doped semiconductor region 115 adjacent sides of the spacers 140.

A hardmask 150 is formed on a top surface of a portion of the ILD layer 145, spacers 140 and the cap layer 135 to cover portions corresponding to the dummy gate 130 and a side of doped semiconductor region 115 that will form a source/drain region. The hardmask 150 can include, for example, silicon oxide (SiOx), silicon nitride (SiN), boron nitride (BN), silicon boron nitride (SiBN), and/or silicon oxynitride (SiON), or other appropriate material.

Figure 8B:
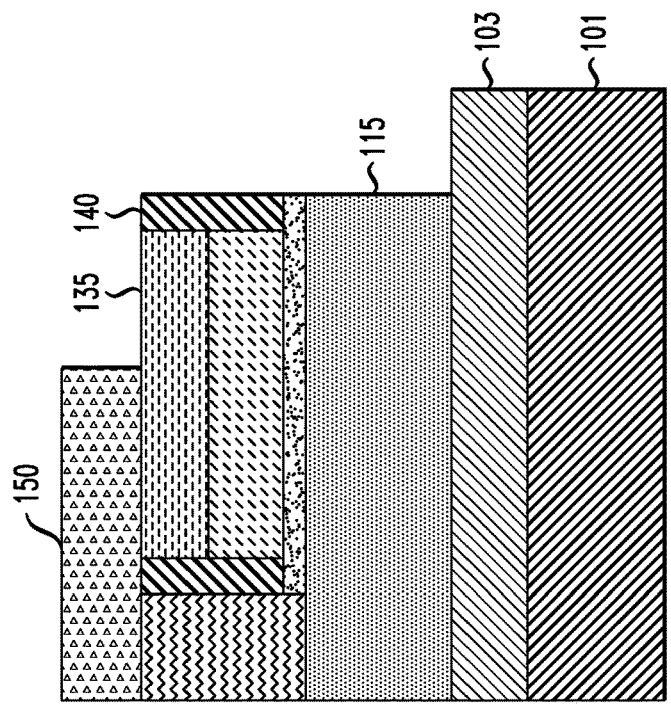
FIGS. 8A and 8B are cross-sectional views illustrating recessing of a source/drain region in a method of manufacturing of a transistor device, according to an embodiment of the present invention.
Figure 8A:
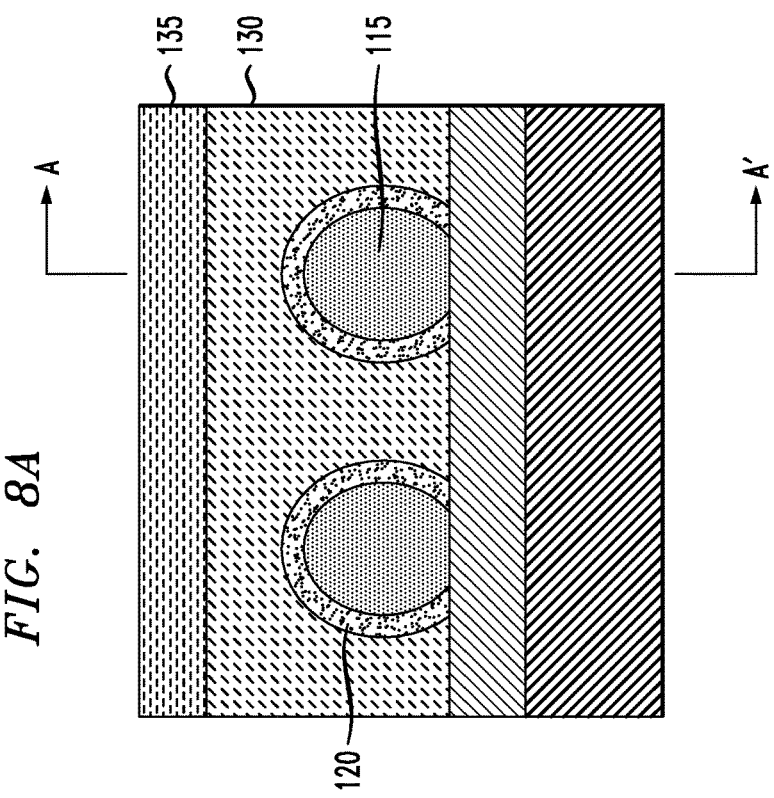

FIGS. 8A and 8B are cross-sectional views illustrating recessing of a source/drain region in a method of manufacturing of a transistor device, according to an embodiment of the present invention. Referring to FIGS. 8A and 8B, a directional etching process, such as ME, is performed to remove the portion of the ILD layer 145 and doped semiconductor (e.g., source/drain) region 115 on one side where the ILD layer 145 and the doped semiconductor region are not protected by the hardmask 150. As can be seen, the exposed portions of the ILD layer 145 and the doped semiconductor region 115 are removed from lateral sides. The ILD layer 145 and doped semiconductor region 115 can be recessed using any suitable etching technique in the art, including for example, anisotropic dry etching techniques such as ME, ion beam etching and plasma etching. For the ILD layer 145, an etchant including, but not necessarily limited to CF$_4$ or CHF$_3$ with inert gas mixtures can be used. For the doped semiconductor region 115, an etchant including HCL gas can be used. In some embodiments, suitable wet etching techniques may also be used.

Figure 9B:
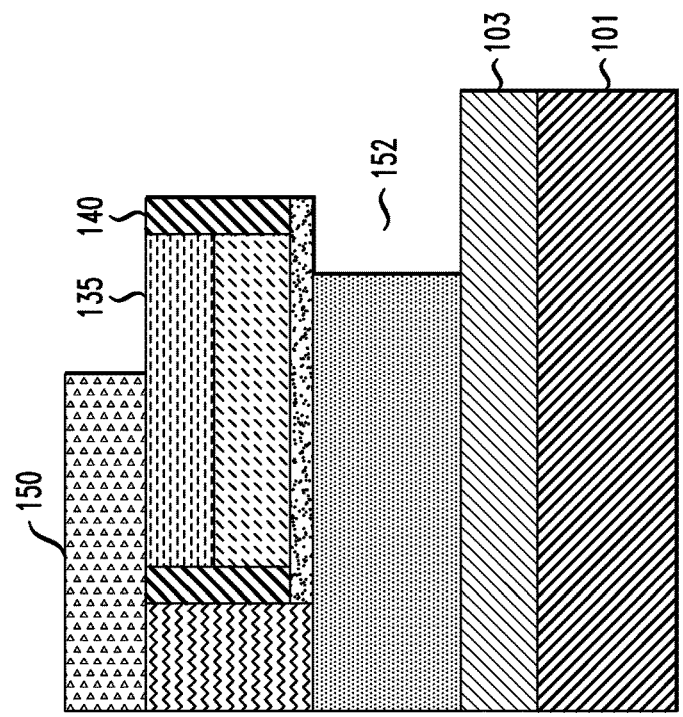
FIGS. 9A and 9B are cross-sectional views illustrating further recessing of a source/drain region in a method of manufacturing of a transistor device, according to an embodiment of the present invention.
Figure 9A:
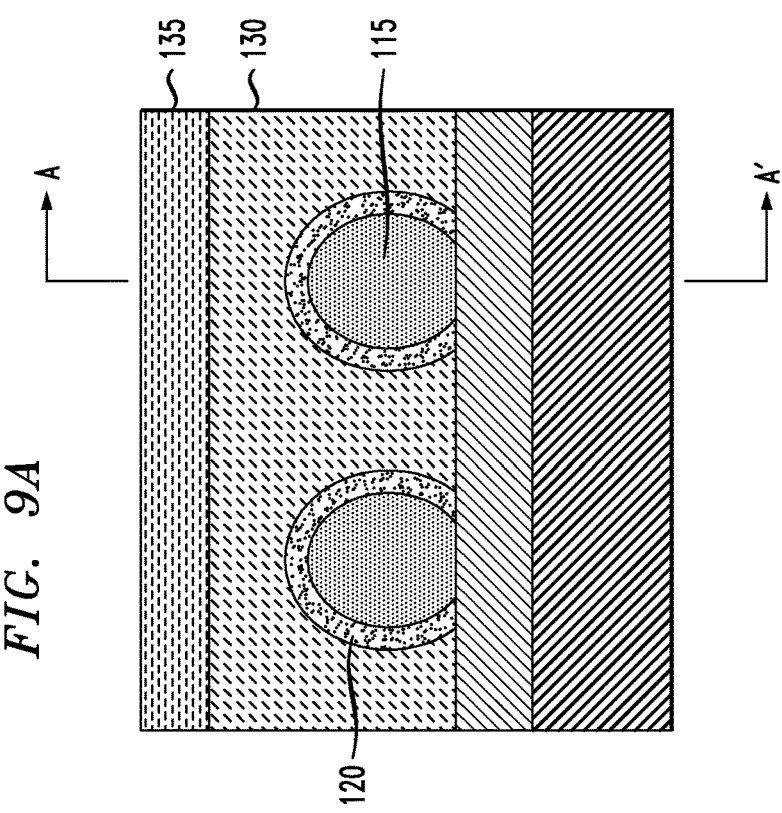

FIGS. 9A and 9B are cross-sectional views illustrating further recessing of a source/drain region in a method of manufacturing of a transistor device, according to an embodiment of the present invention. Referring to FIGS. 9A and 9B, leaving the hardmask 150 in place, the source/drain region 115 is further laterally recessed from an exposed sidewall surface to form a divot 152 under the channel region 120. In accordance with an embodiment a lateral depth of the recess with respect to an edge of the channel region is in the range of about 5 nm to about 30 nm, such as about 10 nm to about 20 nm. The recessing can be performed using an isotropic etch such as gas phase etch, plasma etch, or wet etch which selectively removes the material of the source/drain region 115 (e.g., P+SiGe) with respect to the material of the channel region 120 (e.g., Si). The lateral etch can be performed using, for example, using gas phase HCl. A temperature range at which etching with gas phase HCl is performed is about 400° C. to about 700° C. Other etchants that can be used, include, but are not necessarily limited to hot SC1 (NH$_4$OH:H$_2$O$_2$:H$_2$O) solution.

FIGS. 10A and 10B are cross-sectional views illustrating back-filling a portion of a vacant area left by the recessing of the source/drain region with a dielectric material in a method of manufacturing of a transistor device, according to an embodiment of the present invention. Referring to FIGS. 10A and 10B, the divot 152 is back-filled with a dielectric material 155, such as, for example, an oxide, nitride or low-k dielectric, using one or more conformal deposition techniques including, but not necessarily limited to, CVD or ALD. Following the conformal deposition process, a directional etch, such as RIE, is performed to remove horizontal portions of the deposited dielectric material, deposited, for example, on exposed horizontal surfaces of the source/drain region 115. The dielectric material 155 covers the semiconductor region 115 during subsequent lateral epitaxial growth of a source/drain region 160 from the channel region 120 (discussed further in connection with FIGS. 11A and 11B) on a right side of the dielectric layer 155 and lateral epitaxial growth does not occur from the semiconductor region 115. In addition, as discussed further herein below in connection with FIG. 11B, the dielectric layer 155 isolates the source/drain region 115 on a left side from the source/drain region 160.

FIGS. 11A and 11B are cross-sectional views illustrating growth of a source/drain region in a method of manufacturing of a transistor device, according to an embodiment of the present invention. Referring to FIGS. 11A and 11B, an epitaxial source/drain layers 160 is laterally grown from the exposed silicon channel region 120. The epitaxial source/drain layer 160 is located on the buried insulating layer 103 and extends along a portion of the side of the right spacer 140.

The epitaxial source/drain layer 160 becomes a source/drain region for a transistor device, including source/drain region 115 on the other side of the gate region. In accordance with an embodiment of the present invention, the source/drain region 115 is a p-doped source, while the source/drain region 160 is an n-doped drain. As can be seen, the dielectric 155 electrically isolates the source/drain regions 115 and 160 from each other. In the case of an n-type source/drain region 160, (e.g., N+), the region 160 comprises in-situ phosphorous doped (ISPD) Si:C, at concentrations of about $1E19/cm^3$ to about $1E21/cm^3$.

Figure 12B:
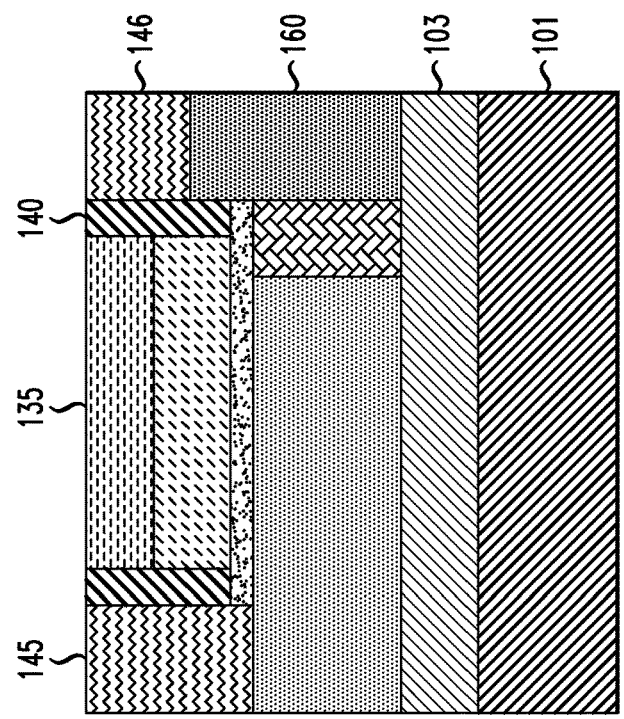
FIGS. 12A and 12B are cross-sectional views illustrating hardmask removal, and ILD layer deposition in a method of manufacturing of a transistor device, according to an embodiment of the present invention.
Figure 12A:
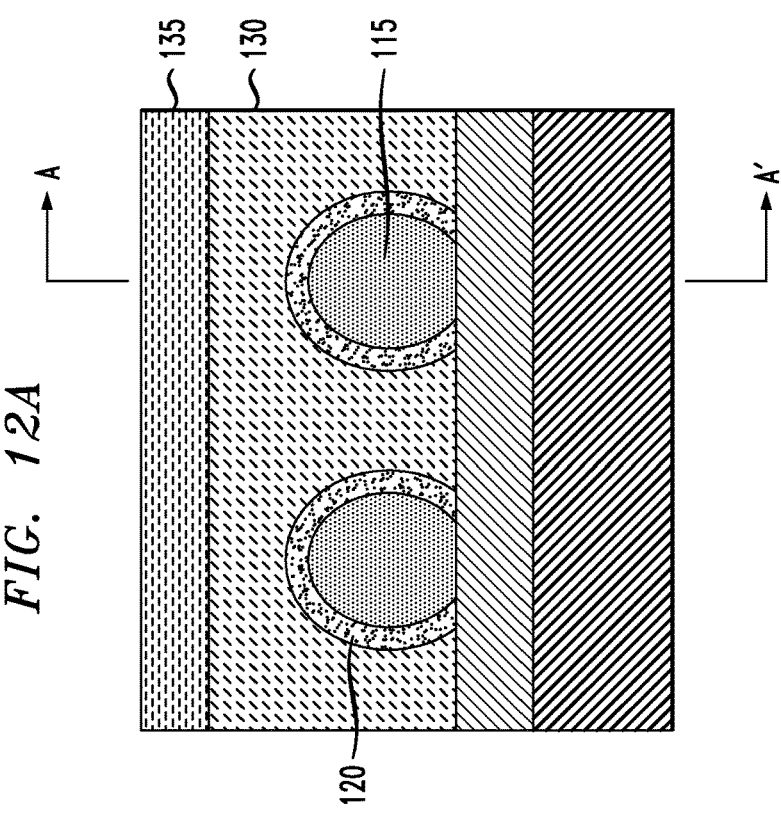

FIGS. 12A and 12B are cross-sectional views illustrating hardmask removal, and ILD layer deposition in a method of manufacturing of a transistor device, according to an embodiment of the present invention. Referring to FIGS. 12A and 12B, the hardmask 150 is removed by any one of various chemical etching processes. In the case that the hardmask 150 is silicon nitride, the selective etch process can include, but is not necessarily limited to, a fluorinated gas ($CH_4$, or $CHF_3$) based plasma etch. An alternative etch process is a wet etch containing hot phosphoric acid ($H_3PO_4$). In addition, another ILD layer 146 is deposited to fill in the area above the source/drain region 160 where a portion of the previously deposited ILD layer 145 was removed. Similar to the ILD layer 145, the ILD layer 146 can include, for example, $SiO_2$, LTO, HTO, and/or FOX, and is deposited using a deposition process, such as, for example, CVD, PECVD, PVD, ALD, MBD, PLD, and/or LSMCD. The deposited layer is planarized down to the cap layer 135 using a planarization process, such as, for example, CMP.

Figure 13A:
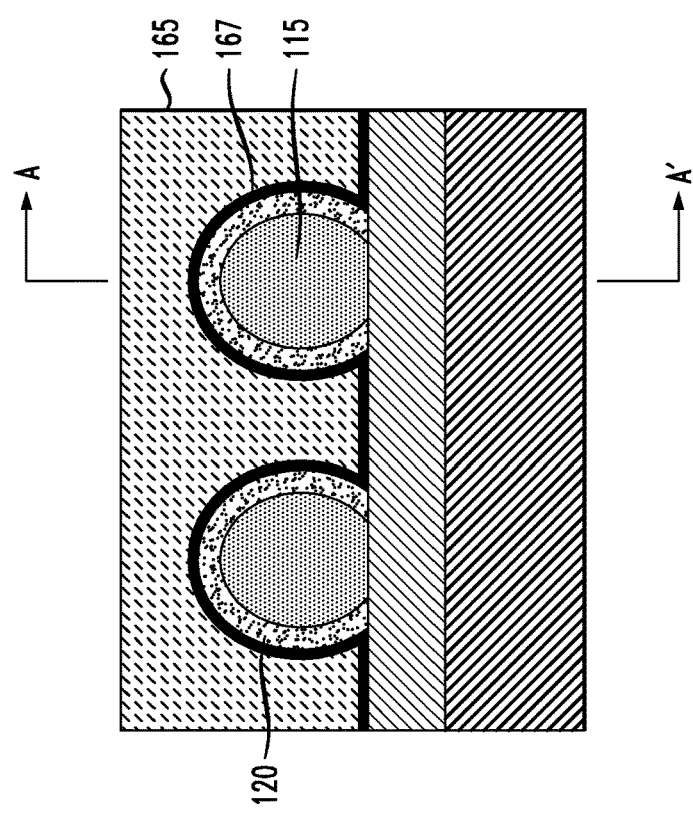
FIGS. 13A and 13B are cross-sectional views illustrating replacement metal gate (RMG) processing in a method of manufacturing of a transistor device, according to an embodiment of the present invention.
Figure 13B:
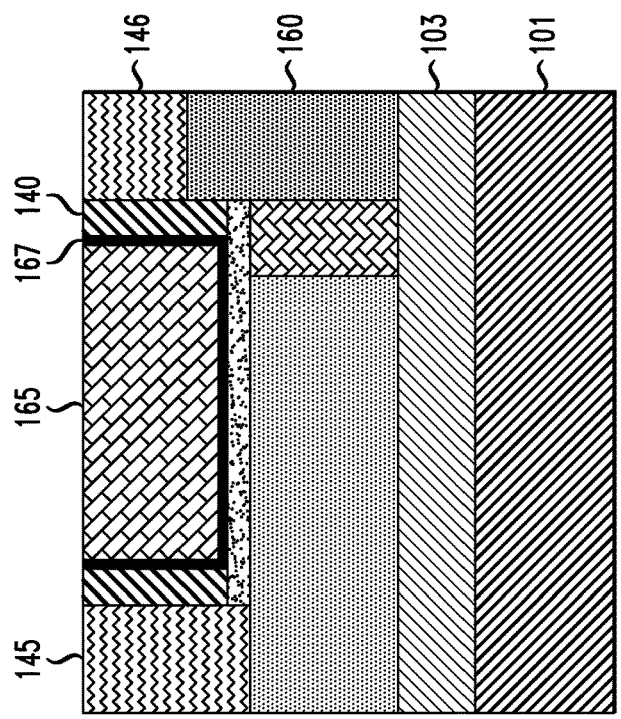

FIGS. 13A and 13B are cross-sectional views illustrating replacement metal gate (RMG) processing in a method of manufacturing of a transistor device, according to an embodiment of the present invention. Referring to FIGS. 13A and 13B, the cap layer 135 and the dummy gate 130 are selectively removed. Then, gate structures including, for example, a gate layer and a high-k dielectric layer are formed in place of the removed cap layer 135 and dummy gate 130.

In accordance with an embodiment of the present invention, the gate structure includes a gate dielectric layer 167 such as, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. As shown in FIG. 13A, the gate dielectric layer 167 is formed on the channel region 120 around the perimeter or circumference of the doped semiconductor regions 115. In addition, referring to FIG. 13B, the gate dielectric layer 167 is positioned between the spacers 140 and the gate layer 165 on sidewalls and between the channel region 120 and the gate layer 165 at a bottom of the gate layer 165.

The gate layer 165 is positioned on and around the structures including the channel region 120 formed along the perimeter or circumference of the doped semiconductor region 115 (e.g., source/drain region). The gate layer 165 is further positioned between the spacers 140 on the channel region 120. According to an embodiment, the gate layer 165 includes a work-function metal (WFM) layer, including but not necessarily limited to, for a PFET, titanium nitride (TiN), tantalum nitride (TaN) or ruthenium (Ru), and for an NFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN, which can be deposited on the gate dielectric layer 167. The gate layer 165 further includes, but is not necessarily limited to, metals, such as, for example, tungsten, cobalt, zirconium, tantalum, titanium, aluminum, ruthenium, and/or copper, metal carbides, metal nitrides, transition metal aluminides, tantalum carbide, titanium carbide, tantalum magnesium carbide, or combinations thereof deposited on the WFM layer and the gate dielectric layer 167.

The layers for the gate structure including the gate and gate dielectric layers 165, 167 can be deposited using, for example, CVD, PECVD, RFCVD, PVD, ALD, MLD, MBD, PLD, LSMCD, and/or sputtering, followed by planarization by, for example, CMP.

Figure 14B:
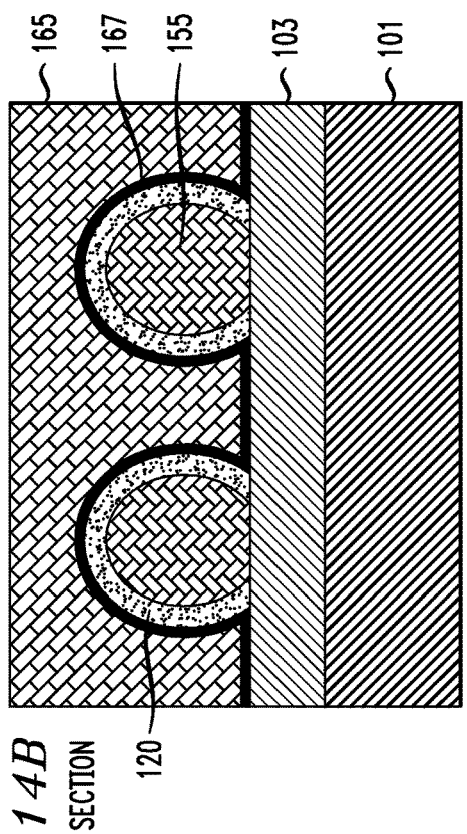
FIGS. 14A, 14B and 14C are cross-sectional views illustrating the device structure after (RMG) processing in a method of manufacturing of a transistor device, according to an embodiment of the present invention.
Figure 14C:
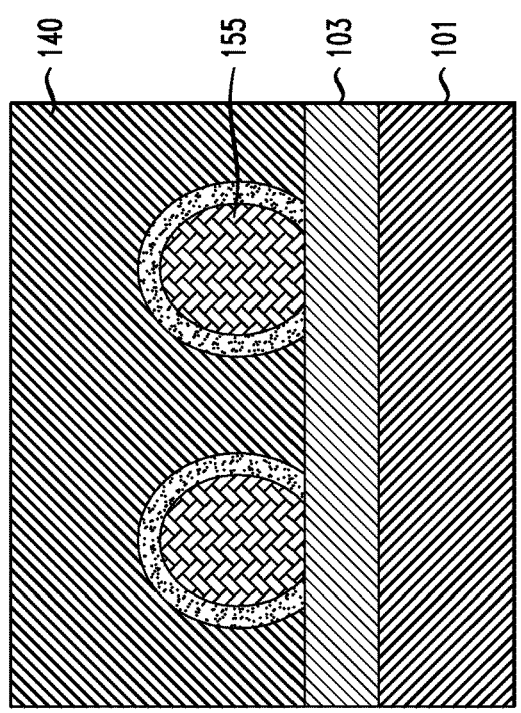
Figure 14A:
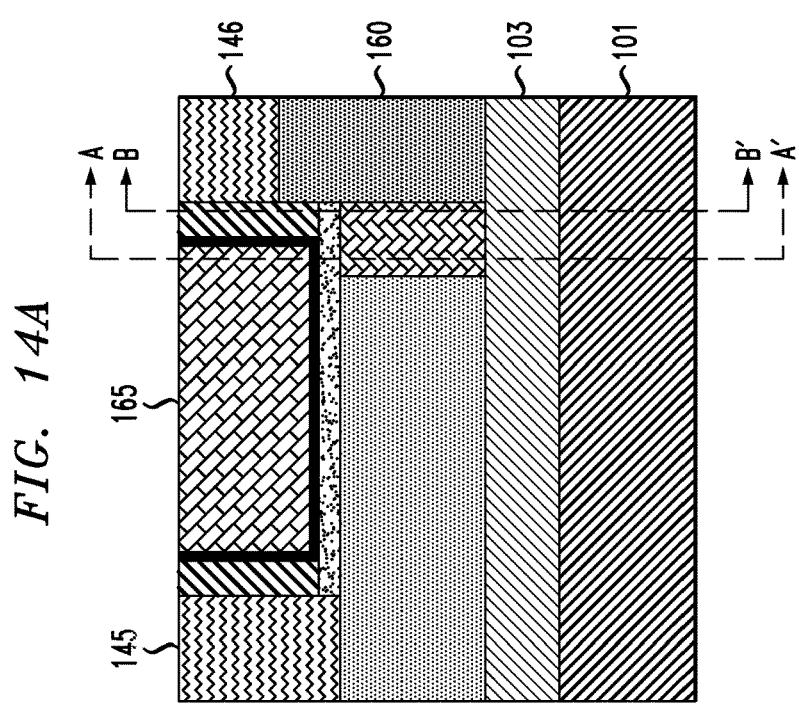

FIGS. 14A, 14B and 14C are cross-sectional views illustrating the device structure after (RMG) processing in a method of manufacturing of a transistor device, according to an embodiment of the present invention. FIG. 14B is a cross-sectional view taken along the line A-A' in FIG. 14A, and FIG. 14C is a cross-sectional view taken along the line B-B' in FIG. 14A. FIG. 14B is similar to FIG. 13A, except that the cross-section in FIG. 14B is taken through the dielectric layer 155, and shows the configuration of the channel region 120 on the outer surface along the perimeter or circumference of the dielectric layer 155, which follows the shape of the semiconductor region 115. The gate dielectric 167 is formed around the channel region 120 on the dielectric layer 155, and the gate layer 165 is formed on and around the dielectric layer 155 where the cross-section is taken in FIG. 14B.

FIG. 14C shows a cross-section along line B-B' in FIG. 14A, which is also taken through the dielectric layer 155, but does not include the gate layer 165, and instead includes the spacer 140. In the view in FIG. 14C, similar to what is shown in FIG. 14B, the configuration of the channel region 120 around the perimeter or circumference of the dielectric layer 155, which follows the shape of the semiconductor region 115, is shown. Instead of the gate and gate dielectric layers 165, 167, the spacer layer 140 with respect to the dielectric layers 155 and the channel region 120 are shown.

Figure 15:
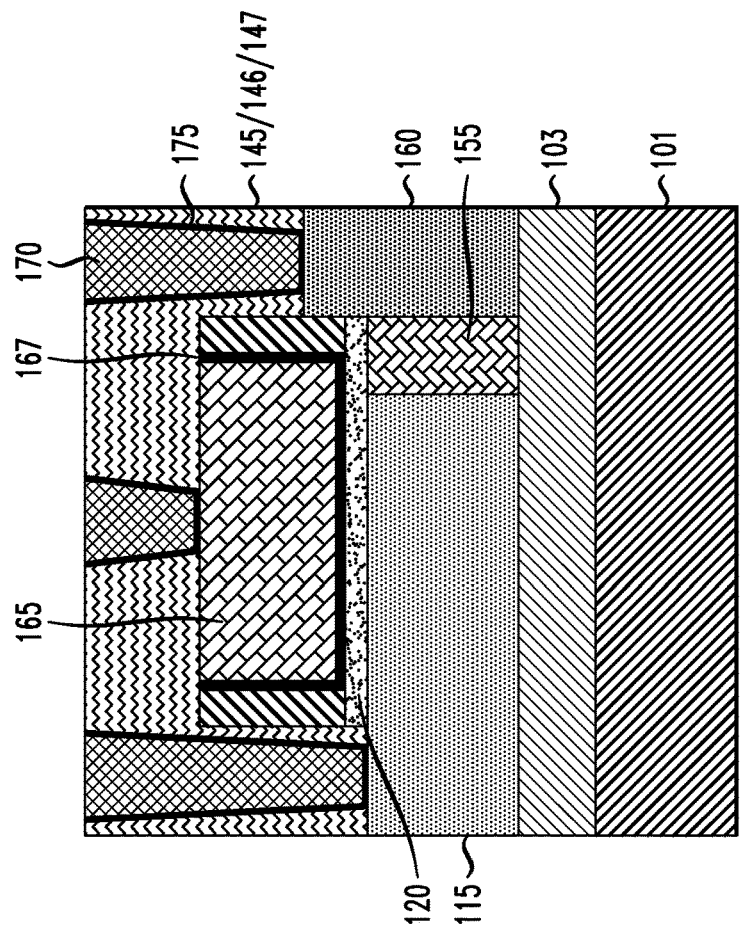
FIG. 15 is a cross-sectional view illustrating ILD layer deposition and contact formation in a method of manufacturing of a transistor device, according to an embodiment of the present invention.

FIG. 15 is a cross-sectional view illustrating ILD layer deposition and contact formation in a method of manufacturing of a transistor device, according to an embodiment of the present invention. Referring to FIG. 15, another ILD layer 147 is deposited to fill in the area above the gate layer 165, the spacers 140 and the previously deposited ILD layers 145 and 146. Similar to the ILD layer 145, the ILD layer 147 can include, for example, $SiO_2$, LTO, HTO, and/or FOX, and is deposited using a deposition process, such as, for example, CVD, PECVD, PVD, ALD, MBD, PLD, and/or LSMCD. The deposited layer is planarized down to the cap layer 135 using a planarization process, such as, for example, CMP.

As shown in FIG. 15, contacts 170 to the source/drain regions 115, 160 and to the gate layer 165 are shown. According to an embodiment of the invention, source/drain and gate contacts 170 can be formed by etching contact area trenches through the ILD layer 145/146/147 to the source/drain and gate regions 115, 160 and 165. The trenches are filled with a contact material, such as, for example, electrically conductive material including, but not necessarily limited to, tungsten, cobalt, zirconium, tantalum, titanium, aluminum, ruthenium, and/or copper. A liner layer 175, including, for example, titanium and titanium nitride, may be formed along sidewall and bottom surfaces in the trenches before filling a remaining portion of the trenches with the electrically conductive material to form the contact regions/areas. Excess materials from the contact areas formed above the top surface of the ILD layer 145/146/147 can be removed utilizing a planarization process, such as CMP.

Figure 16:
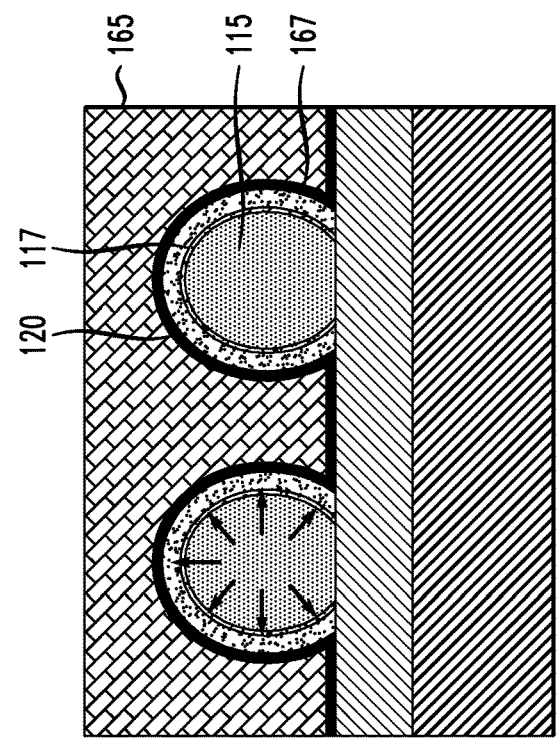
FIG. 16 is a cross-sectional view illustrating band to band tunneling (BTBT), according to an embodiment of the present invention.

FIG. 16 is a cross-sectional view illustrating band to band tunneling (BTBT), according to an embodiment of the present invention. FIG. 16 illustrates that, in accordance with an embodiment of the present invention, a 3D TFET has increased source-to-channel area due to the rounded structure of the source/drain region 115 and the channel region 120 wrapped around the rounded structure, which results in an increased on-current for the transistor. A BTBT tunneling area 117 is illustrated between, for example, a P+ source/drain region 115 comprising SiGe, and a channel region 120. The arrows illustrate a BTBT direction. Gate and gate dielectric layers 165 and 167, as well as a substrate 101 and buried insulating layer 103 are also illustrated in FIG. 16.

In an N-type TFET, the source and drain are heavily doped with p and n type dopants respectively. In a P-type TFET, the source and drain are heavily doped with n and p type dopants respectively. According to embodiments of the present invention, tunneling occurs in the region 115. Typically, the region 115 is referred to as a source. In this disclosure, the terms "source" or "source/drain" are used to refer to the region 115 and the terms "drain" or "source/drain" are used to refer to region 160.

Figure 17:
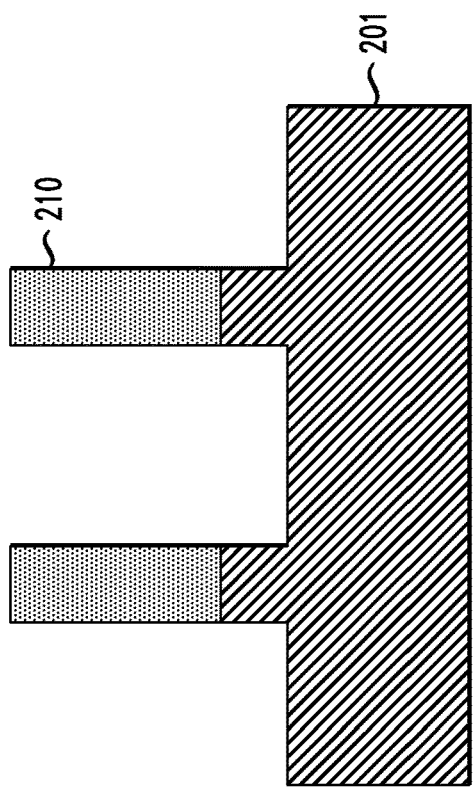
FIGS. 17 and 18 are cross-sectional views illustrating semiconductor fin formation and dielectric deposition on a bulk substrate in a method of manufacturing of a transistor device, according to an embodiment of the present invention.
Figure 18:
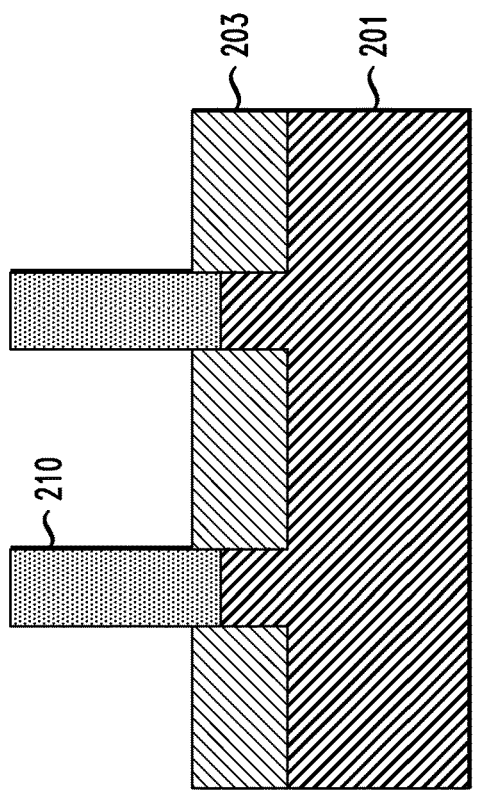

FIGS. 17 and 18 are cross-sectional views illustrating semiconductor fin formation and dielectric deposition on a bulk substrate in a method of manufacturing of a transistor device, according to an embodiment of the present invention. Referring to FIGS. 17 and 18, instead of starting with a structure including SiGe on an insulator on a semiconductor substrate as shown in FIG. 1, a bulk silicon substrate 201 is used. As shown in FIG. 17, SiGe fins 210 can be patterned from an epitaxially grown SiGe layer. Patterning is performed by a method known in the art, for example, sidewall image transfer and etching. As shown in FIG. 18, in order to form isolation (e.g., STI) regions, a dielectric layer 203 is deposited and recessed to a desired height after fin patterning. The dielectric layer 203 can be deposited using a deposition process, such as, for example, CVD, PECVD, PVD, ALD, MBD, PLD, and/or LSMCD. The deposited layer can be planarized using a planarization process, such as, for example, CMP, and then recessed using an appropriate etching process.

Figure 20:
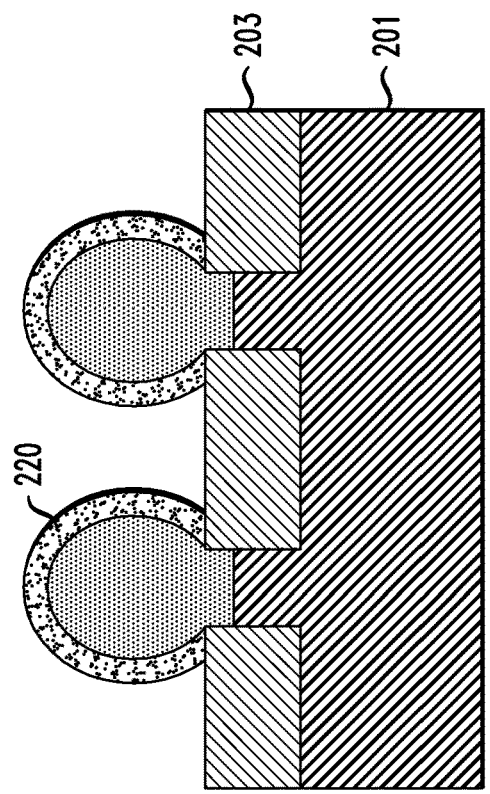
FIGS. 19 and 20 are cross-sectional views illustrating processing for rounding the fins and epitaxial growth of a semiconductor channel region on the rounded fins in a method of manufacturing of a transistor device, according to an embodiment of the present invention.
Figure 19:
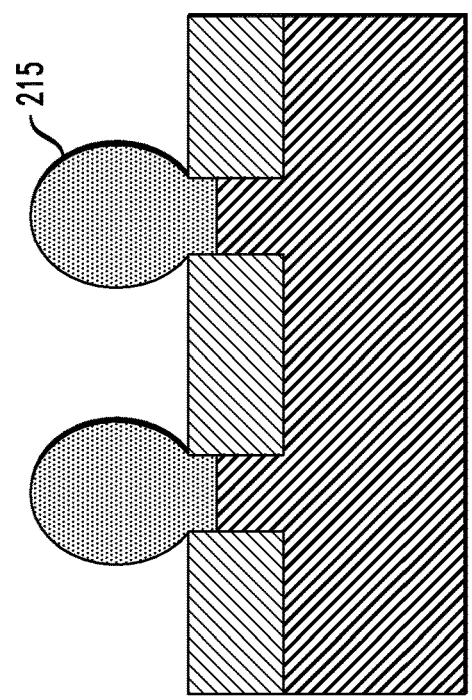

FIGS. 19 and 20 are cross-sectional views illustrating processing for rounding the fins and epitaxial growth of a semiconductor channel region on the rounded fins in a method of manufacturing of a transistor device, according to an embodiment of the present invention. Referring to FIG. 19, similar to what is described in connection with FIG. 3, a high temperature annealing process is performed to form the fins 210 into a rounded shape, such as, for example, a circular or oval shape, resulting in the rounded fins 215 on the deposited insulating layer 203.

Similar what is described in connection with FIG. 4, a semiconductor channel region 220, including, but not necessarily limited to, silicon, strained Si, SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof, is epitaxially grown each on the rounded doped semiconductor regions 215 (e.g., P+ SiGe). The semiconductor channel region 220 is formed on the outer surface along the perimeter or circumference of each of the rounded doped semiconductor regions 215. In accordance with an embodiment of the present invention, the annealing and epitaxial growth is performed in the same epitaxy chamber.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a transistor device, comprising:
    forming a plurality of fins on a substrate;
    performing an annealing process to cause the fins to have a round shape;
    growing an epitaxial semiconductor layer on a surface of each fin, wherein the epitaxial semiconductor layer is formed along the round shape;
    forming a gate structure on the substrate, wherein the gate structure is formed on the epitaxial semiconductor layer on the surface of each fin;
    laterally recessing a portion of a fin to form a vacant area under a corresponding epitaxial semiconductor layer on the fin;
    wherein the vacant area leaves a portion of a bottom surface of the epitaxial semiconductor layer exposed;
    filling the vacant area with a dielectric layer; and
    growing an additional epitaxial semiconductor layer from an exposed lateral side of the corresponding epitaxial semiconductor layer on the fin.

2. The method according to claim 1, wherein the annealing process is performed at a temperature in a range of about 500° C. to about 1200° C.

3. The method according to claim 2, wherein the annealing process is performed in a hydrogen ambient.

4. The method according to claim 1, wherein the round shape is at least one of circular and oval.

5. The method according to claim 1, wherein each of the plurality of fins comprises a doped semiconductor material.

6. The method according to claim 5, wherein each epitaxial semiconductor layer formed along the round shape comprises a semiconductor material different from the doped semiconductor material of the plurality of fins.

7. The method according to claim 5, wherein each of the plurality of fins comprises a source/drain region of the transistor device.

8. The method according to claim 7, wherein each epitaxial semiconductor layer comprises a channel region of the transistor device.

9. The method according to claim 1, wherein the additional epitaxial semiconductor layer extends on to the substrate adjacent the dielectric layer.

10. The method according to claim 9, wherein the fin comprises a semiconductor material having a first doping type, and the additional epitaxial semiconductor layer comprises a semiconductor material having a second doping type different from the first doping type.

11. The method according to claim 1, wherein the transistor device comprises a tunnel field-effect transistor.

12. The method according to claim 1, wherein the dielectric layer has a round shape.

13. The method according to claim 12, wherein the epitaxial semiconductor layer is formed along the round shape of the dielectric layer.

* * * * *